United States Patent
Chung et al.

(10) Patent No.: US 12,336,313 B2
(45) Date of Patent: Jun. 17, 2025

(54) BACK SIDE ILLUMINATION IMAGE SENSOR AND METHOD OF MANUFACTURING THE SAME

(71) Applicant: Powerchip Semiconductor Manufacturing Corporation, Hsinchu (TW)

(72) Inventors: Chih-Ping Chung, Hsinchu (TW); Saysamone Pittikoun, Hsinchu County (TW); Chih-Hao Peng, Taoyuan (TW); Ming-Yu Ho, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 424 days.

(21) Appl. No.: 18/152,061

(22) Filed: Jan. 9, 2023

(65) Prior Publication Data
US 2024/0170526 A1    May 23, 2024

(30) Foreign Application Priority Data
Nov. 22, 2022 (TW) .................... 111144669

(51) Int. Cl.
*H10F 39/12* (2025.01)
*H10F 39/00* (2025.01)

(52) U.S. Cl.
CPC ......... *H10F 39/199* (2025.01); *H10F 39/024* (2025.01); *H10F 39/8053* (2025.01);
(Continued)

(58) Field of Classification Search
CPC . H10F 39/199; H10F 39/80373; H10F 39/807
See application file for complete search history.

(56) References Cited

U.S. PATENT DOCUMENTS

2019/0109163 A1    4/2019 Lai et al.
2021/0134864 A1    5/2021 Lee et al.
(Continued)

FOREIGN PATENT DOCUMENTS

TW    201027734    7/2010
TW    202232743    8/2022

OTHER PUBLICATIONS

G. Shahidi et al., "Fabrication of CMOS on ultrathin SOI obtained by epitaxial lateral overgrowth and chemical-mechanical polishing", International Technical Digest on Electron Devices, Dec. 9-12, 1990, pp. 1-4.
(Continued)

*Primary Examiner* — Matthew L Reames
(74) *Attorney, Agent, or Firm* — JCIPRNET

(57) ABSTRACT

A back side illumination (BSI) image sensor includes an epitaxial substrate, a deep trench isolation (DTI) structure from one surface to the other surface of the epitaxial substrate, a buried oxide layer on the epitaxial substrate, an epitaxial layer, a well region, a floating diffusion (FD) region, a shallow trench isolation (STI) structure, and vertical transfer gates (VTGs). The buried oxide layer has openings exposing the epitaxial substrate, and the epitaxial layer is formed on the epitaxial substrate and covers the buried oxide layer. The well region is in the epitaxial layer and the epitaxial substrate. The FD region is in the well region above the buried oxide layer, and a width of the buried oxide layer is larger than that of the FD region. The STI structure is in the epitaxial layer. The VTGs are in the epitaxial layer and through the openings of the buried oxide layer.

15 Claims, 22 Drawing Sheets

(52) U.S. Cl.
CPC ..... *H10F 39/8057* (2025.01); *H10F 39/8063* (2025.01); *H10F 39/811* (2025.01)

(56) References Cited

U.S. PATENT DOCUMENTS

| | | |
|---|---|---|
| 2021/0143191 A1 | 5/2021 | Ha et al. |
| 2021/0164917 A1 | 6/2021 | Chuang et al. |
| 2021/0351223 A1* | 11/2021 | Nomoto ................ H10F 39/812 |
| 2022/0359481 A1 | 11/2022 | Jiang et al. |
| 2024/0170518 A1* | 5/2024 | Takatsuka ........... H10F 39/8063 |

OTHER PUBLICATIONS

Sangwoo Pae et al., "Multiple layers of silicon-on-insulator islands fabrication by selective epitaxial growth", IEEE Electron Device Letters, May 1999, pp. 194-196.

Seong Hyun Lee et al., "Demonstration of Reconfigurable FET and Logic Gates on Epitaxial Lateral Overgrowth Silicon Platform", IEEE Transactions on Electron Devices, Sep. 1, 2022, pp. 5443-5449.

"Office Action of Taiwan Counterpart Application", issued on Sep. 6, 2023, p. 1-p. 4.

* cited by examiner

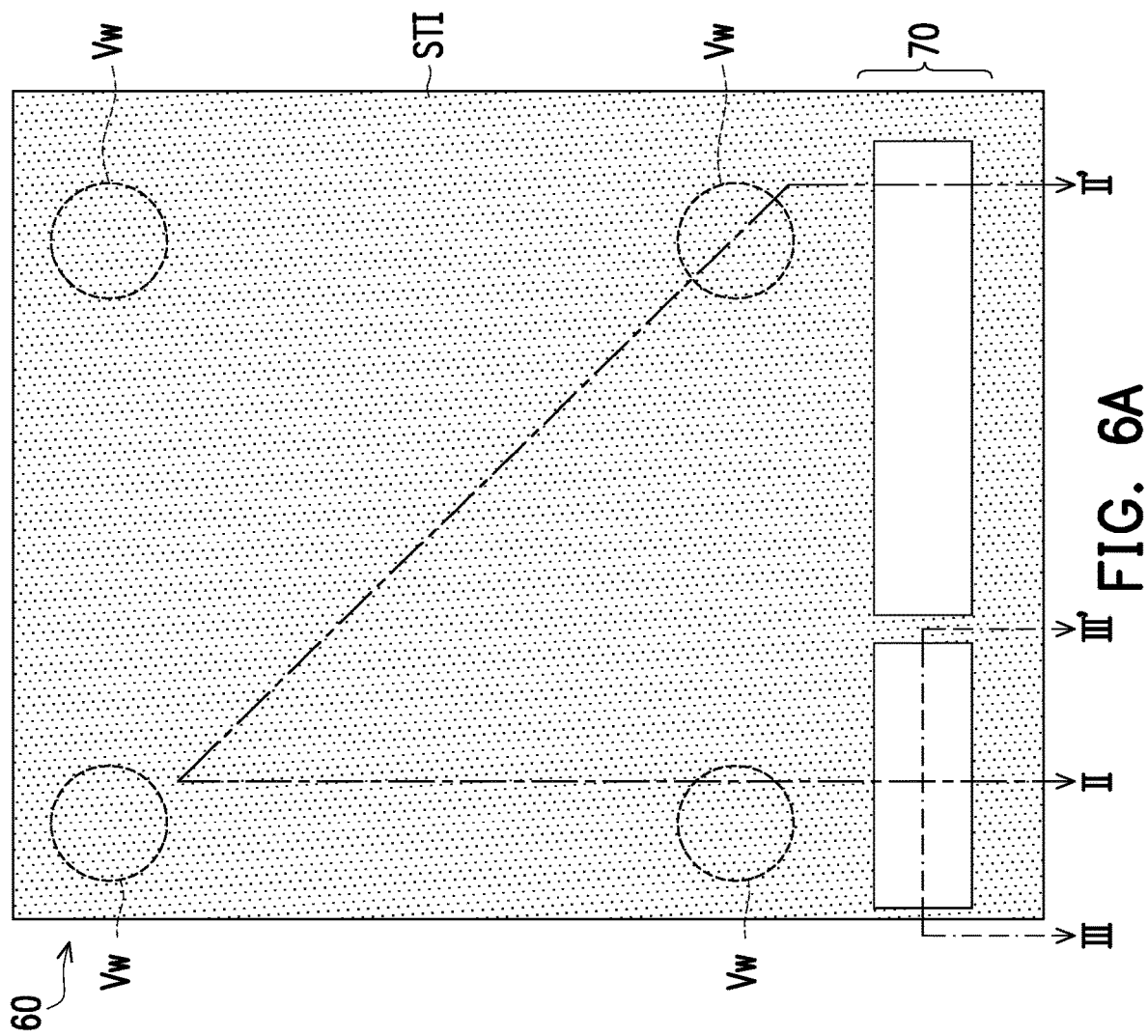

BACK SIDE ILLUMINATION IMAGE SENSOR AND METHOD OF MANUFACTURING THE SAME

CROSS-REFERENCE TO RELATED APPLICATION

This application claims the priority benefit of Taiwan application serial no. 111144669, filed on Nov. 22, 2022. The entirety of the above-mentioned patent application is hereby incorporated by reference herein and made a part of this specification.

BACKGROUND

Technical Field

The disclosure relates to an image sensor technology, and particularly, to a back side illumination (BSI) image sensor and a method manufacturing thereof.

Description of Related Art

Back side illumination image sensors have been widely applied in various electronic devices (e.g., mobile phones, digital cameras, biomedical imaging devices or automatic imaging devices, etc.). However, when a back side illumination image sensor is used to sense incident light, part of the incident light may be reflected to other parts through an isolation structure, resulting in a decrease in quantum efficiency (QE), and the incident light reflected to other parts may also cause optical crosstalk (X-talk).

In addition, the floating diffusion (FD) region in the conventional back side illumination image sensor usually overlaps with a deep trench isolation (DTI) structure in layout. To form a high aspect ratio deep trench isolation structure, high power and complicated etching steps, and a high aspect ratio process (HARP) are usually required. Therefore, defects are easily formed between the deep trench isolation (DTI) structure and the floating diffusion (FD), and a problem of fixed picture noise (FPN) occurs. Furthermore, to increase the full well capacity (FWC) in the image sensor, multiple high-energy ion implantation processes are usually required to form a deeper photodiode (PD). Therefore, lattice defects are easily generated in the photodiode, thereby causing a high dark current and affecting image quality.

SUMMARY

The disclosure provides a back side illumination image sensor capable of reducing optical and electrical crosstalk (X-talk) between photosensitive element regions and preventing the floating diffusion region FD from being damaged, thereby reducing a problem of fixed image noise (FPN). In addition, with the epitaxial substrate as the photosensitive element region, a problem of dark current may be reduced.

The disclosure also provides a method of manufacturing the back side illumination image sensor to form a back side illumination image sensor with high quantum efficiency and less optical and electrical crosstalk.

The back side illumination image sensor of the disclosure includes an epitaxial substrate having a first surface and a second surface opposite to each other, a deep trench isolation (DTI) structure, a buried oxide (BOX) layer, an epitaxial layer, a well region, a floating diffusion (FD) region, a shallow trench isolation (STI) structure, and multiple vertical transfer gates (VTGs). The deep trench isolation structure extends from the second surface to the first surface of the epitaxial substrate to divide the epitaxial substrate into multiple regions. The buried oxide layer is disposed on the first surface of the epitaxial substrate, and the buried oxide layer has multiple openings exposing the multiple regions. The epitaxial layer is formed on the first surface of the epitaxial substrate and covers the buried oxide layer. The well region is formed in the epitaxial layer and extends to the first surface of the epitaxial substrate, wherein the regions other than the well region become multiple photosensitive element regions. The floating diffusion region is formed in the well region above the buried oxide layer between the photosensitive element regions, and the width of the buried oxide layer is greater than the width of the floating diffusion region. The shallow trench isolation structure is disposed in the epitaxial layer and in contact with the buried oxide layer, so that the shallow trench isolation structure, the deep trench isolation structure and the buried oxide layer form a continuous isolation structure. The vertical transfer gates are disposed in the epitaxial layer and pass through the openings of the buried oxide layer.

In an embodiment of the disclosure, the interface between the well region and the photosensitive element region is concave.

In an embodiment of the disclosure, the openings have inclined sidewalls.

In an embodiment of the disclosure, the vertical transfer gates have inclined sidewalls.

In an embodiment of the disclosure, the buried oxide layer is in direct contact with the deep trench isolation structure.

In an embodiment of the disclosure, in a plan view, the area of each opening of the buried oxide layer is less than the area of each of the photosensitive element regions.

In an embodiment of the disclosure, the back side illumination image sensor may further include an anti-reflection layer, a metal shielding layer, a color filter layer, and a microlens. The anti-reflection layer is disposed on the second surface of the epitaxial substrate; the metal shielding layer is disposed on the anti-reflection layer; the color filter layer is disposed on the metal shielding layer; the microlens is disposed on the color on the filter layer.

In an embodiment of the disclosure, the epitaxial layer and the epitaxial substrate are made of the same material.

In an embodiment of the disclosure, the back side illumination image sensor may further include an interconnection structure disposed on the epitaxial layer and a carrier substrate disposed on the interconnection structure.

A method of manufacturing a back side illumination image sensor of the disclosure includes steps as follows. A shallow trench isolation structure is formed on a first surface of the epitaxial substrate; multiple openings and trenches are formed in the shallow trench isolation structure, where the trenches are located above the openings, and the openings expose the epitaxial substrate; an epitaxial layer is formed in the openings and the trenches; a well region is formed in the epitaxial layer and extends into the epitaxial substrate; multiple vertical transfer gates (VTGs) passing through the openings are formed in the epitaxial layer; a floating diffusion (FD) region is formed in the epitaxial layer between the vertical transfer gates, and in a plan view, the floating diffusion region and the openings do not overlap each other; a deep trench isolation structure extending from the second surface to the first surface of the epitaxial substrate is formed, so as to divide the epitaxial substrate into multiple photosensitive element regions, and the second surface is opposite to the first surface.

In another embodiment of the disclosure, the step of forming the deep trench isolation structure includes by using the shallow trench isolation structure as an etching stop layer, etching the epitaxial substrate to form a deep trench; forming a conformal passivation layer within the deep trench; and filling the silicon oxide layer in the deep trench.

In another embodiment of the disclosure, the step of forming the epitaxial layer includes an epitaxial lateral overgrowth (ELO) process.

In another embodiment of the disclosure, the epitaxial substrate is thinned from the second surface of the epitaxial substrate before forming the deep trench isolation structure.

In another embodiment of the disclosure, after forming the deep trench isolation structure, an anti-reflection layer is formed on the second surface of the epitaxial substrate; a metal shielding layer is formed on the anti-reflection layer; a color filter layer is formed on the metal shielding layer; and a microlens is formed on the color filter layer.

In another embodiment of the disclosure, after forming the floating diffusion region, an interconnection structure is formed on the epitaxial layer; and a carrier substrate is bonded to the interconnection structure.

In summary, in the back side illumination image sensor of the disclosure, the epitaxial substrate is used as the photosensitive element region, so favorable quantum efficiency (QE) and lower dark current (DC) can be achieved, and each photosensitive element region is surrounded by continuous isolation structures (including shallow trench isolation structures and deep trench isolation structures). Therefore, the optical and electrical crosstalk between each photosensitive element region PD can be reduced. Furthermore, in the disclosure, a buried oxide layer with a larger width is used and disposed under the floating diffusion region, so that the floating diffusion region can be prevented from being damaged as much as possible, and the problem of fixed picture noise (FPN) can be further reduced. Moreover, with the formation of the floating diffusion region on the buried oxide layer, parasitic capacitance can also be reduced, thereby increasing the voltage conversion gain of photoelectrons in the floating diffusion region.

In order to make the features and advantages of the disclosure comprehensible, embodiments accompanied with drawings are described in detail below.

BRIEF DESCRIPTION OF THE DRAWINGS

FIG. 6A and FIG. 6B each are a plan view and a cross-sectional view illustrating steps of forming a shallow trench isolation structure of a back side illumination image sensor according to a second embodiment of the disclosure.

DESCRIPTION OF THE EMBODIMENTS

Figure 1:
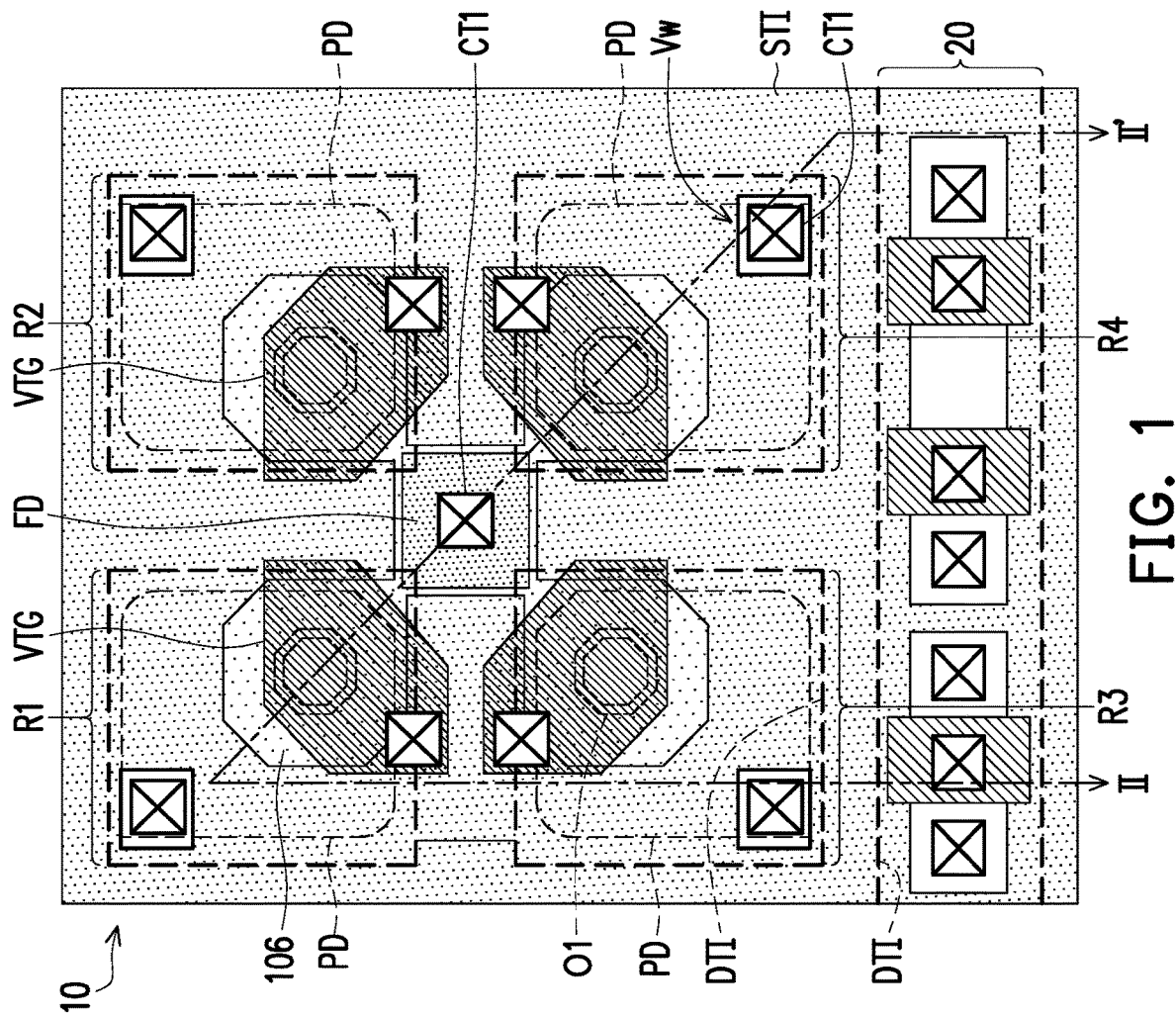
FIG. 1 is a plan view of a back side illumination image sensor according to a first embodiment of the disclosure.

The following description provides several embodiments for implementing various features of the disclosure. In addition, these embodiments are only for illustration but are not intended to limit the scope and the application of the disclosure. Also, the relative sizes (e.g., lengths, thicknesses, spacing, etc.) and the relative positions of regions or structural elements may be reduced or enlarged for clarity. Additionally, similar or identical reference numerals used in different drawings refer to similar or identical elements or features.

Figure 2:
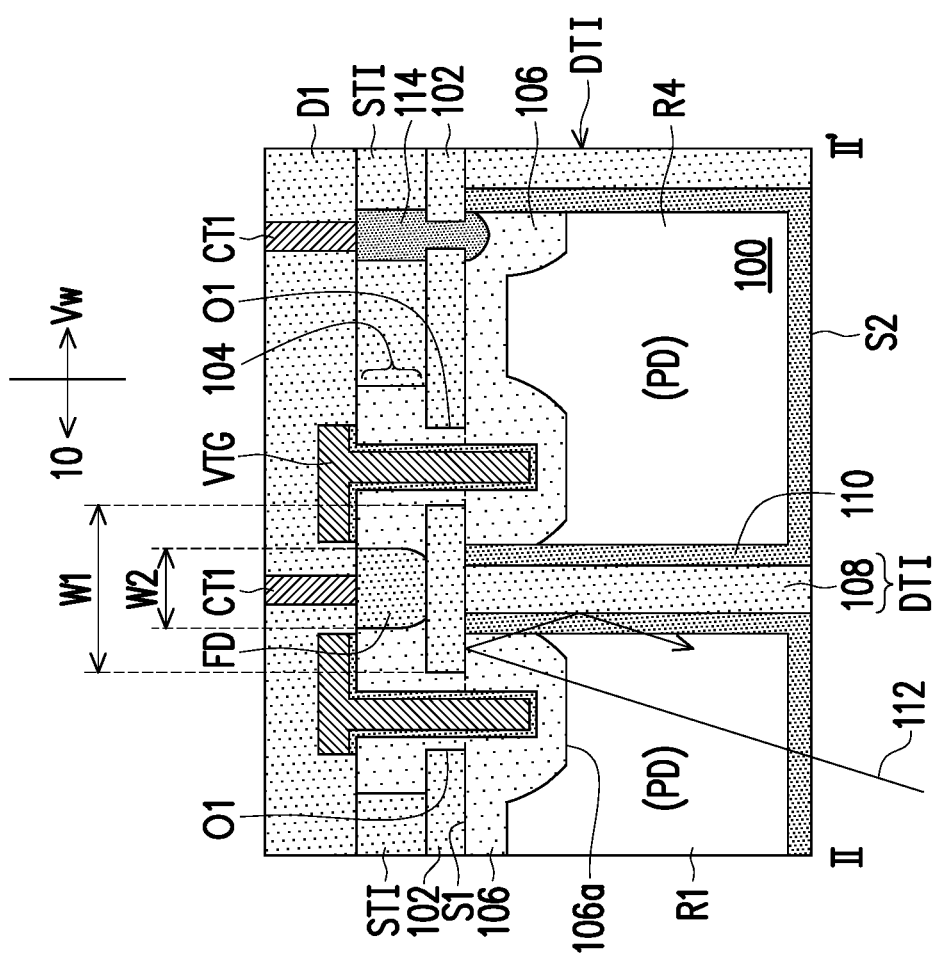
FIG. 2 is a schematic cross-sectional view of part of the back side illumination image sensor taken along line II-IF of FIG. 1.

FIG. 1 is a plan view of a back side illumination image sensor according to a first embodiment of the disclosure. FIG. 2 is a schematic cross-sectional view of part of the back side illumination image sensor taken along line II-IF of FIG. 1.

Referring to FIG. 1 and FIG. 2, a back side illumination image sensor 10 of the first embodiment substantially includes an epitaxial substrate 100 having a first surface S1 and a second surface S2 opposite to each other, a deep trench isolation structure DTI, a buried oxide (BOX) layer 102, an epitaxial layer 104, a well region 106, a floating diffusion region FD, a shallow trench isolation structure STI, and multiple vertical transfer gates VTG. The deep trench isolation structure DTI extends from the second surface S2 to the first surface S1 of the epitaxial substrate 100 to divide the epitaxial substrate 100 into multiple regions R1, R2, R3 and R4. In addition, the epitaxial substrate 100 may further include a well pickup region Vw and a transistor region 20. Usually, an N-type channel transistor is located in a P-type well region, and the pickup voltage of the well region 106 is usually Vss. On the contrary, if it is a P-type channel transistor located in an N-type well region, the pickup voltage of the well region 106 is +Vdd. The well pickup region Vw and the transistor region 20 can be disposed around the back side illumination image sensor as shown in FIG. 1, but the disclosure is not limited thereto. In one embodiment, the deep trench isolation structure DTI includes a silicon oxide layer 108 as well as a passivation layer 110, such as a heavily doped silicon layer (usually an N-type photodiode is a P-type heavily doped silicon layer, and a P-type photodiode is an N-type heavily doped silicon layer) formed on the second surface S2. The buried oxide layer 102 is disposed on the first surface S1 of the epitaxial substrate 100, the buried oxide layer 102 has multiple openings O1 exposing the regions R1-R4 and exposing part of the well region 106 in the epitaxial substrate 100. The epitaxial layer 104 is formed on the first surface S1 of the epitaxial substrate 100 and covers the buried oxide layer 102, where the epitaxial layer 104 and the epitaxial substrate 100 can be made of the same material, such as silicon. Moreover, the epitaxial layer 104 can be formed by an epitaxial lateral overgrowth (ELO) process, and the detailed steps are illustrated in the subsequent paragraphs.

Referring to FIG. 2 again, the well region 106 is formed in the epitaxial layer 104 and extends to the first surface S1 of the epitaxial substrate 100, and the regions R1-R4 outside the well region 106 become multiple photosensitive element regions PD. Compared with the conventional N-type photodiode formed by multiple ion implantation processes, the epitaxial substrate 100 has a lower and more uniform doping concentration (e.g., a concentration below $1E16/cm^3$); therefore, the photosensitive element region PD of the disclosure does not encounter a high-energy implantation process, so a large number of defects can be prevented, and better quantum efficiency (QE) can be achieved. In addition, the well region 106 may also exist in the epitaxial substrate 100 in the well pickup region Vw. In the embodiment, since the well region 106 can be formed by the ion implantation process, an interface 106*a* between the well region 106 and the photosensitive element region PD is concave; that is, the bottom of the well region 106 has a profile that is deeper in the middle (near the opening O1) and shallower in the periphery. The floating diffusion region FD is formed in the well region 106 above the buried oxide layer 102 among the multiple photosensitive element regions PD, and a width W1 of the buried oxide layer 102 is greater than a width W2 of the floating diffusion region FD, so the buried oxide layer 102 of the disclosure can prevent the floating diffusion region FD from being damaged as much as possible during the formation of the deep trench isolation structure DTI, thereby reducing the problem of the fixed picture noise (FPN). In the embodiment, the buried oxide layer 102 can be used as an etching stop layer during etching the deep trench, so the buried oxide layer 102 is in direct contact with the deep trench isolation structure DTI. Moreover, with the formation of the floating diffusion region FD on the buried oxide layer 102, parasitic capacitance can also be reduced, thereby increasing the voltage conversion gain of photoelectrons in the floating diffusion region FD. In the first embodiment, the floating diffusion region FD and the well region 106 are in different conduction states. For example, the well region 106 is a P-type well and the floating diffusion region FD is an N+ region.

Referring to FIG. 1 and FIG. 2 again, the shallow trench isolation structure STI is disposed in the epitaxial layer 104 and is in contact with the buried oxide layer 102, which allows the shallow trench isolation structure STI, the deep trench isolation structure DTI and the buried oxide layer 102 to form a continuous isolation structure, and the optical and electrical crosstalk (X-talk) between the multiple photosensitive element regions PD is reduced as much as possible. The vertical transfer gate VTG is disposed in the epitaxial layer 104 and passes through the opening O1 of the buried oxide layer 102, where the vertical transfer gate VTG may include a polysilicon layer and a gate oxide layer. Since the vertical transfer gate VTG passes through the opening O1 and extends into the well region 106 of the epitaxial substrate 100, a VTG channel is formed for coupling the photosensitive element region PD and the floating diffusion region FD. Furthermore, in the plan view (FIG. 1), the area of each opening O1 of the buried oxide layer 102 is less than the area of each photosensitive element region PD (e.g., any one of the regions R1-R4), so incident light 112 entering from the second surface S2 (back surface) of the epitaxial substrate 100 may be isolated in each photosensitive element region PD by the buried oxide layer 102 and the deep trench isolation structure DTI, thereby reducing optical and electrical crosstalk. The buried oxide layer 102 can also block the incident light 112 reflected in each photosensitive element region PD, so as to prevent the floating diffusion region FD from being disturbed. As for the electrical transmission, the interconnection structure above the back side illumination image sensor 10 can implement the electrical transmission of the back side illumination image sensor 10. For example, multiple conductive vias CT1 are formed in a dielectric layer D1 and each can be connected to the floating diffusion region FD, vertical transfer gate VTG, and the like. In addition, interconnection structures such as conductive vias CT1 can also be disposed on the well pickup region Vw and the transistor region 20. For example, generally a heavily doped region 114 is disposed in the well pickup region Vw, is in the same conductive state as the well region 106, and can be connected to the outside through the conductive via CT1.

Figure 3:
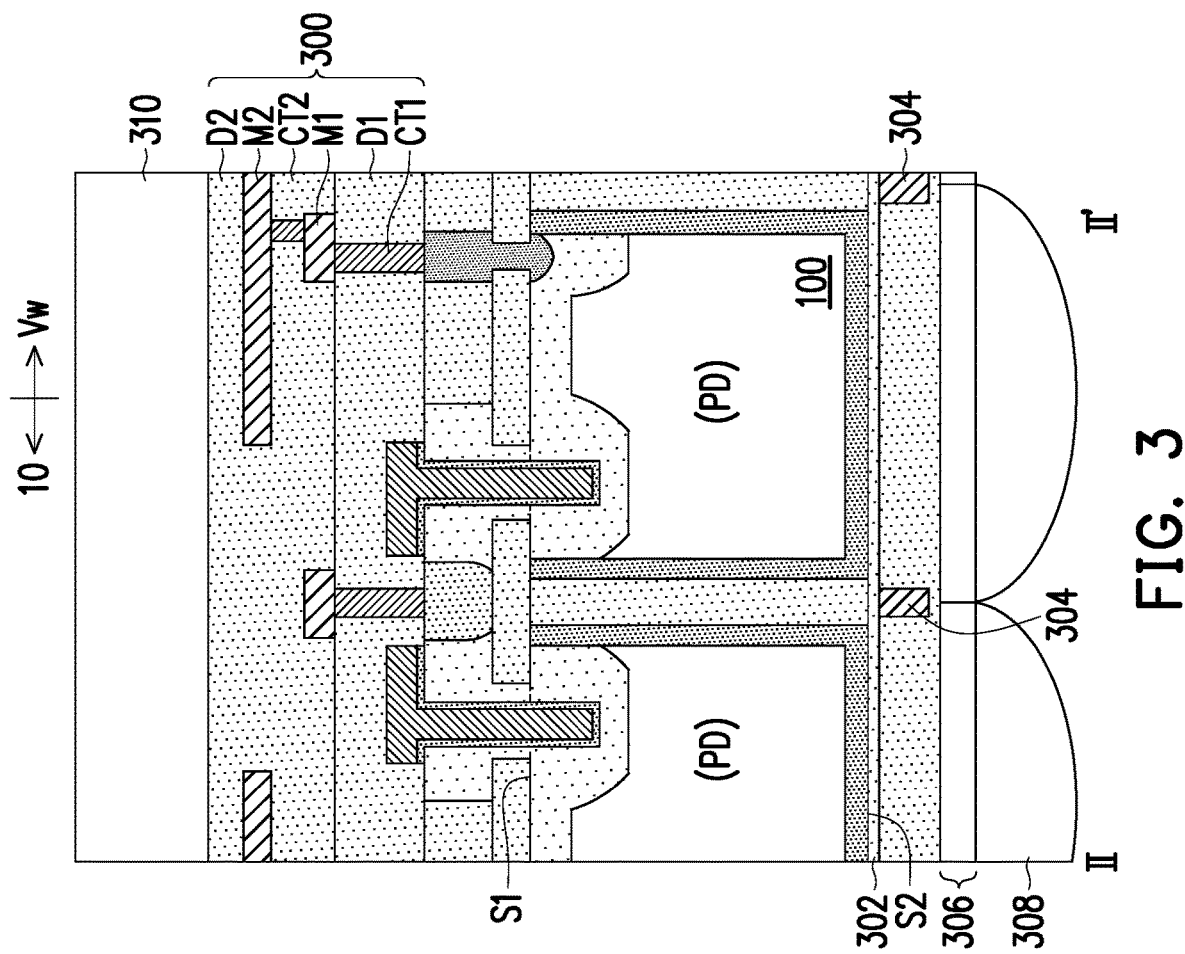
FIG. 3 is a schematic cross-sectional view of the back side illumination image sensor of the first embodiment.

Similarly, FIG. 3 is a schematic cross-sectional view of the back side illumination image sensor of the first embodiment, which includes the complete structure and other elements of FIG. 2.

Referring to FIG. 3, an interconnection structure 300 of the first embodiment may include several dielectric layers D1-D2, several metal layers M1-M2, conductive vias CT1-CT2, etc., and FIG. 3 illustrates only two metal layers M1-M2, but the disclosure is not limited thereto. In other embodiments, the number of metal layers may be greater than two. In addition, a carrier substrate 310 may also be disposed on the interconnection structure 300. As for the back side illumination image sensor 10, an anti-reflection layer 302, a metal shielding layer 304, a color filter layer 306, and a microlens 308 may be sequentially disposed on the second surface S2 of the epitaxial substrate 100, where the metal shielding layer 304 is disposed on the anti-reflection layer 302; the color filter layer 306 is disposed on the metal shielding layer 304; the microlens 308 is disposed on the color filter layer 306. Moreover, the foregoing elements can refer to the prior art. For example, the material of the anti-reflection layer 302 can be TaO and the like; the metal shielding layer 304 can be used to shield the incident light entering different pixels, is generally formed in the oxide layer, and covers the region outside the back side illumination image sensor 10, such as the transistor region 20; the microlens 308 is disposed in the back side illumination image sensor 10.

Figure 4:
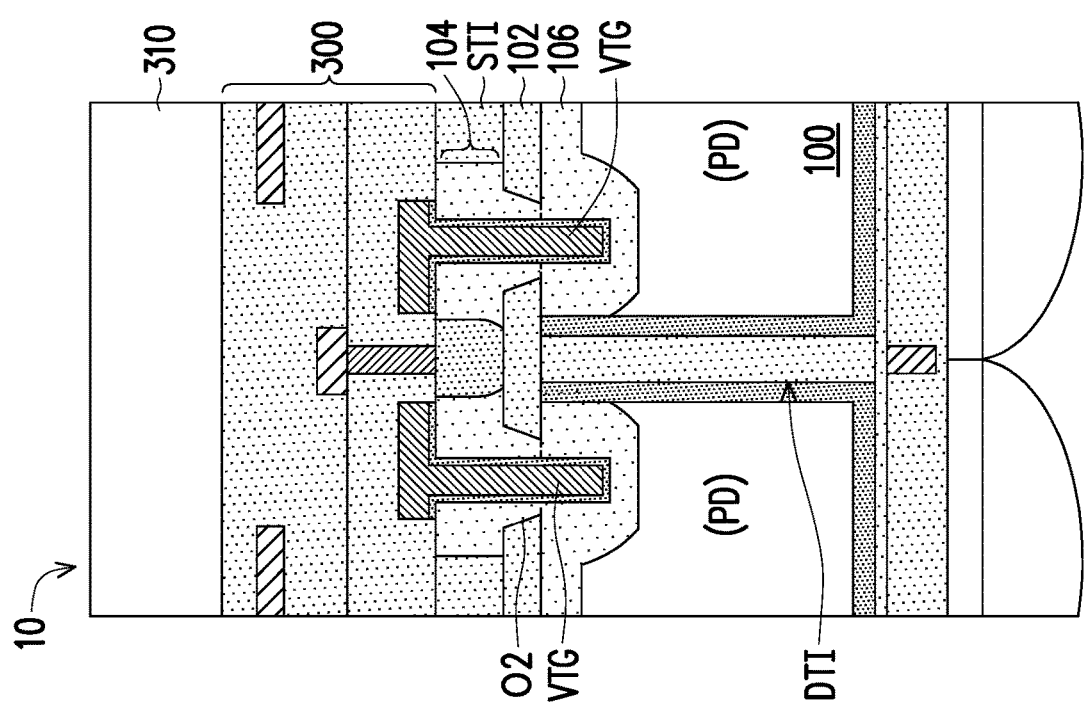
FIG. 4 is a schematic cross-sectional view of another back side illumination image sensor of the first embodiment.

FIG. 4 is a schematic cross-sectional view of another back side illumination image sensor of the first embodiment, where the same reference numerals as those in FIG. 3 are used to refer to the same elements. In FIG. 4, the opening O2 of the buried oxide layer 102 is an opening with inclined sidewalls.

Figure 5:
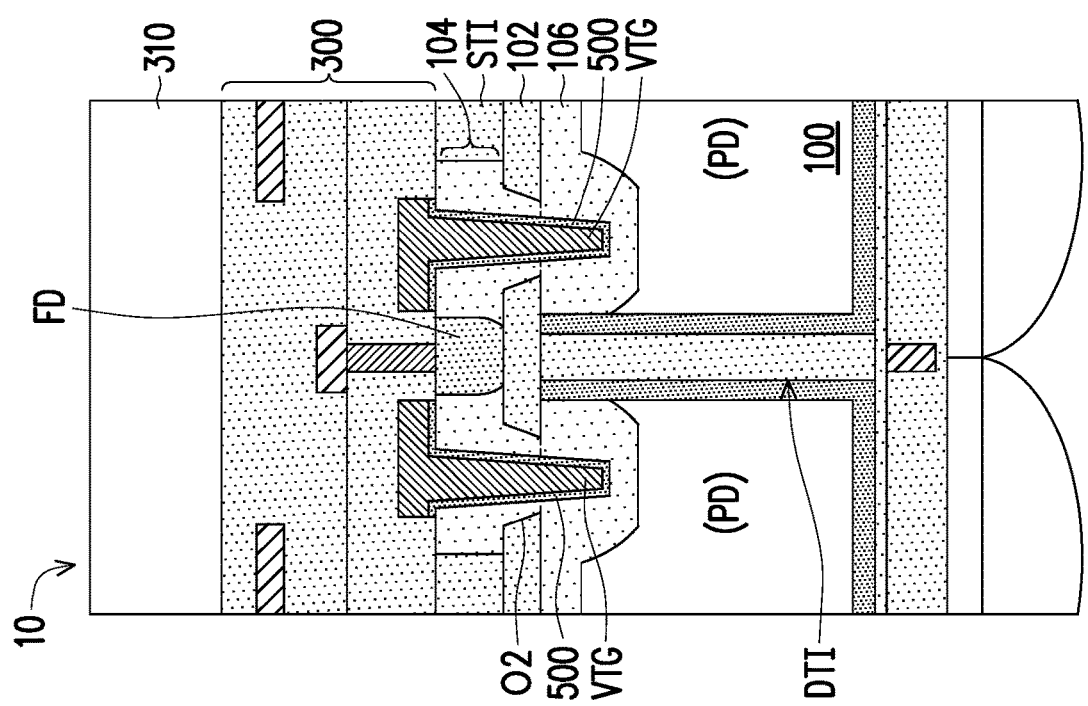
FIG. 5 is a schematic cross-sectional view of yet another back side illumination image sensor of the first embodiment.

FIG. 5 is a schematic cross-sectional view of yet another back side illumination image sensor of the first embodiment, where the same reference numerals as those in FIG. 3 are used to refer to the same elements. In FIG. 5, the vertical transfer gate VTG also has inclined sidewalls 500.

FIG. 6A to FIG. 16 are schematic views illustrating the manufacturing process of a back side illumination image sensor according to the second embodiment of the disclosure, and to clarify the structure of each layer/region, several steps are illustrated in both a plan view and a cross-sectional view.

Figure 6B:
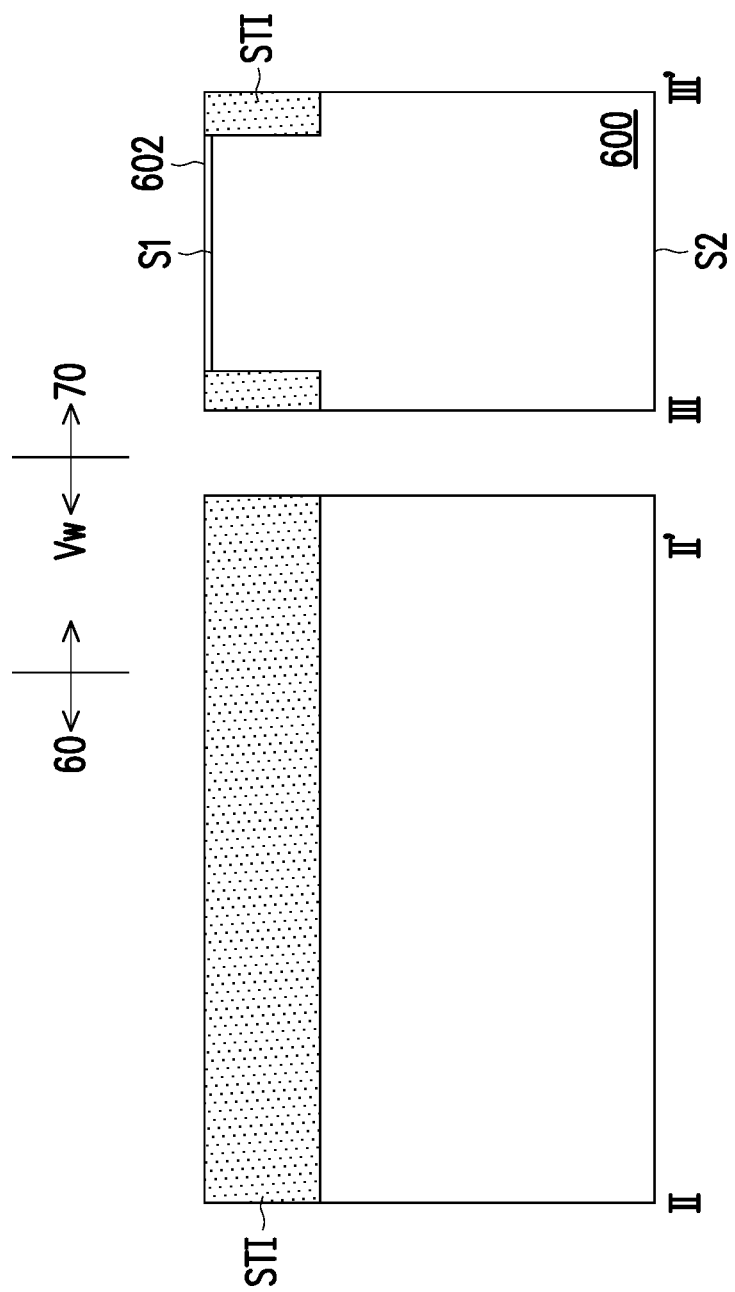

Referring to FIG. 6A and FIG. 6B, FIG. 6A is a plan view, and FIG. 6B is a cross-sectional view illustrating line segment II-II' and line segment III-III' of FIG. 6A. First, a shallow trench isolation structure STI is formed on the first surface S1 of an epitaxial substrate 600, where the epitaxial substrate 600 is, for example, an epitaxial silicon substrate and has a uniform doping concentration. The shallow trench isolation structure STI is substantially formed on the entire first surface S1 of the epitaxial substrate 600, covering the entire part where a back side illumination image sensor 60 and the well pickup region Vw are predeterminedly formed. The first surface S1 of the transistor region 70 is exposed, and a pad oxide layer 602 is formed on the first surface S1.

Figure 7A:
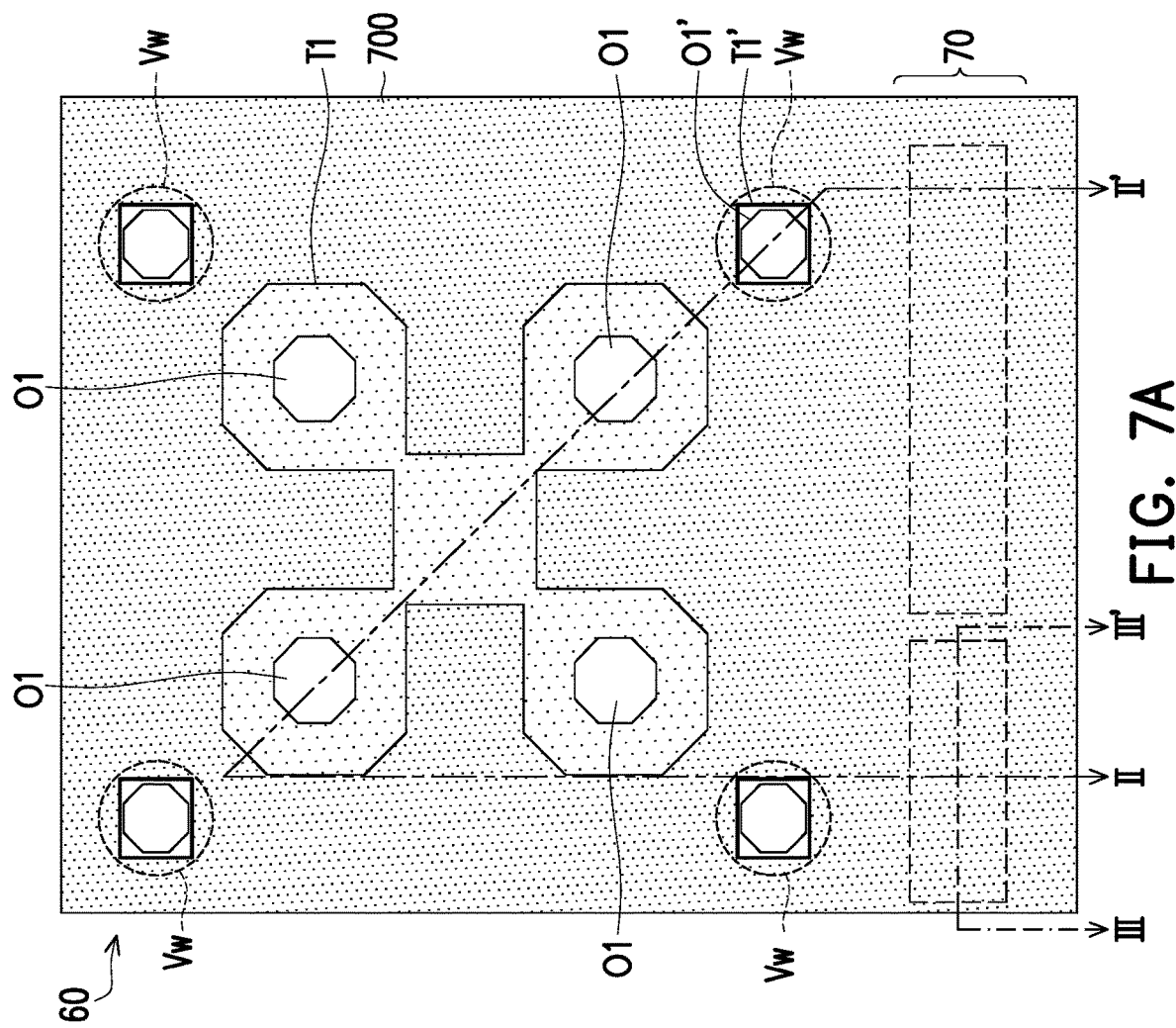
FIG. 7A and FIG. 7B each are a plan view and a cross-sectional view illustrating steps of forming trenches and openings of the back side illumination image sensor of the second embodiment.
Figure 7B:
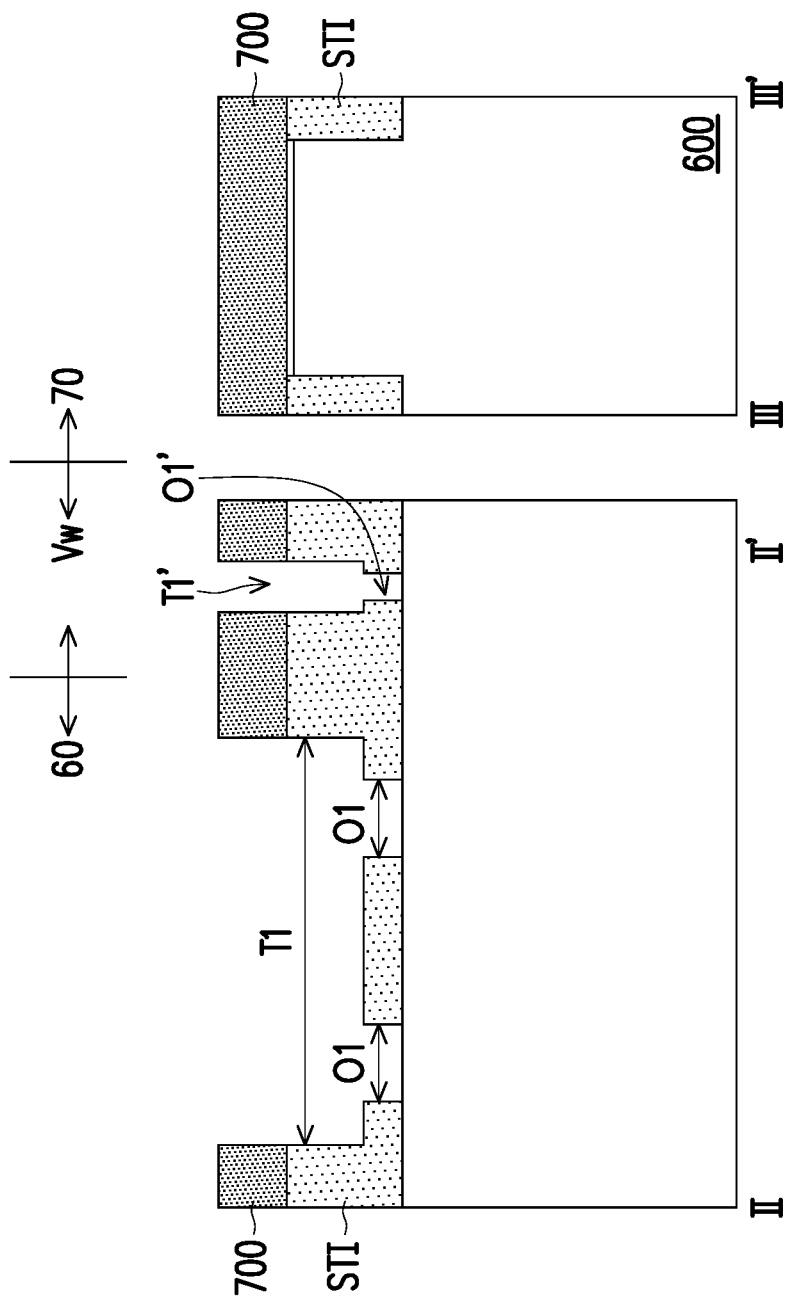

Next, referring to FIG. 7A and FIG. 7B, FIG. 7A is a plan view, and FIG. 7B is a cross-sectional view illustrating line segment II-II' and line segment III-III' of FIG. 7A. Multiple openings O1 and trenches T1 are formed in the shallow trench isolation structure STI of the back side illumination image sensor 60, where the trenches T1 are located above the openings O1, and the openings O1 expose the epitaxial substrate 600. In the method of forming the opening O1 and the trench T1, for example, a hard mask layer 700 is first formed on the epitaxial substrate 600, and then the shallow trench isolation structure STI is etched step by step by means of a dual damascene process to obtain the trench T1 and the opening O1. In this step, openings O1' and trenches T1' can also be formed in the shallow trench isolation structure STI of the well pickup region Vw. Furthermore, the openings O1' and the trenches T1' of the well pickup region Vw may be formed together with the openings O1 and the trenches T1 of the back side illumination image sensor 60 but have different sizes.

Figure 8:
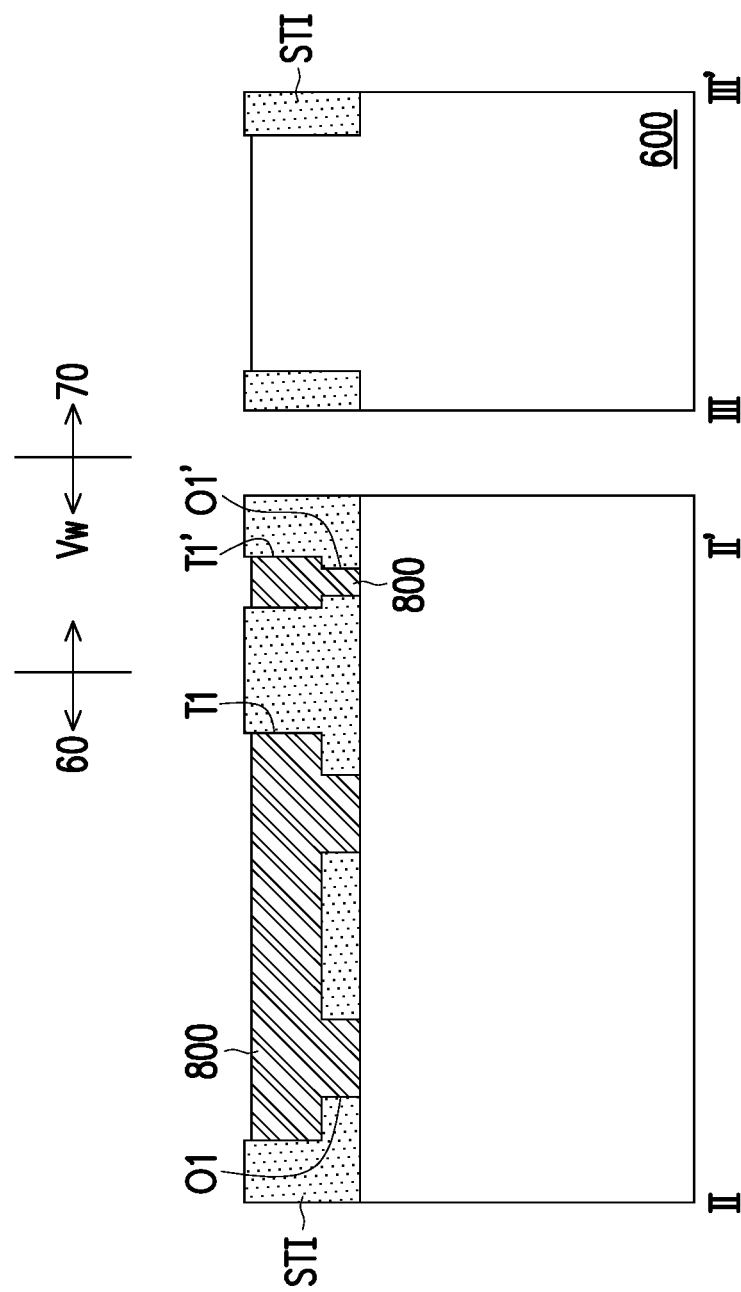
FIG. 8 is a cross-sectional view illustrating steps of forming an epitaxial layer of the back side illumination image sensor of the second embodiment.

Subsequently, referring to FIG. 8, an epitaxial layer 800 is formed in the openings O1, O1' and the trenches T1, T1' by a process, such as an epitaxial lateral overgrowth (ELO) process. Specifically, the part of the epitaxial substrate 600 exposed from the opening O1 can be used as a seed layer, and the epitaxial layer can grow beyond the range of the trenches T1 and T1' by the ELO process, so the epitaxial layer except the trenches T1 and T1' can be removed by a subsequent step of planarization such as CMP, and the material of the formed epitaxial layer 800 can be the same as that of the epitaxial substrate 600. The hard mask layer 700, the pad oxide layer 602, and the like may then be removed, exposing the active region of the transistor region 70.

Figure 9:
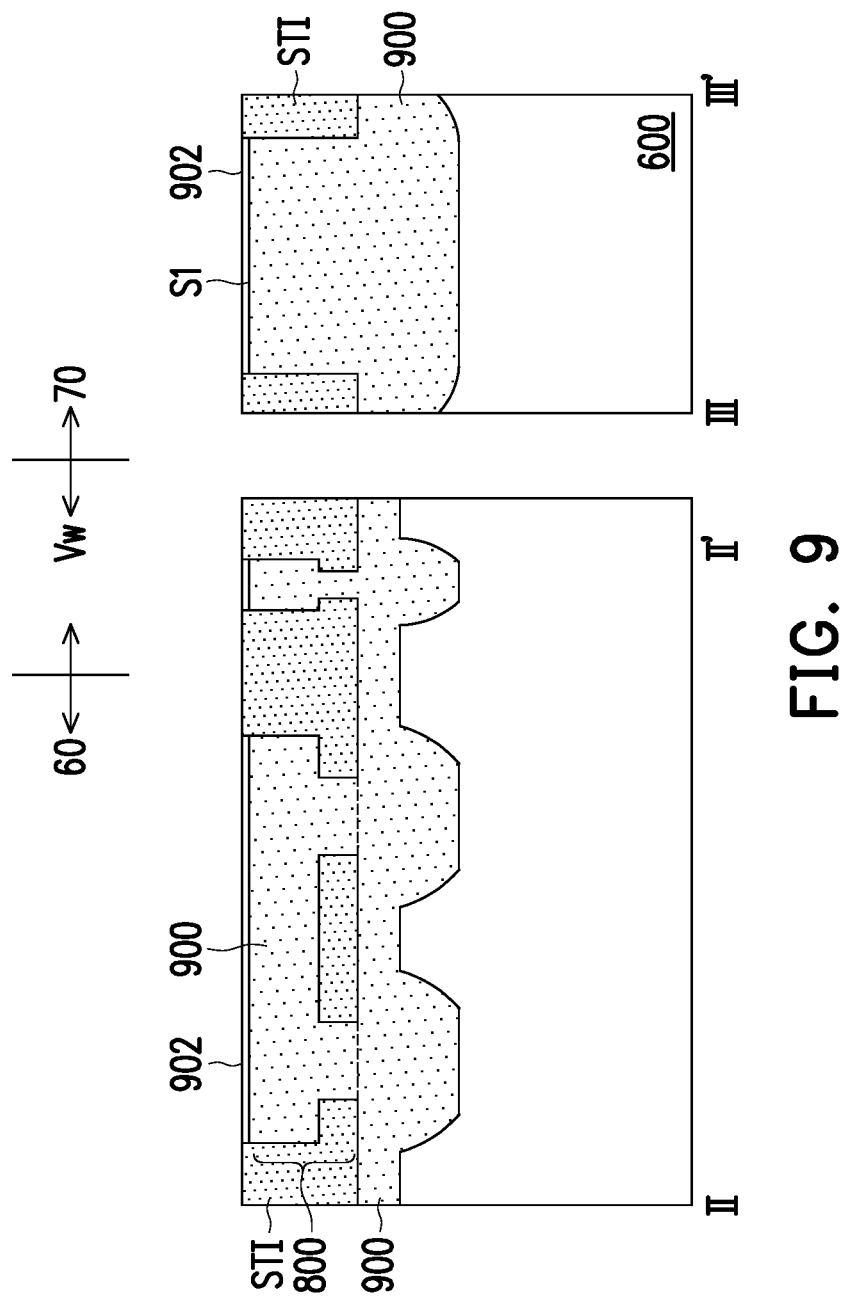
FIG. 9 is a cross-sectional view illustrating steps of forming a well region of the back side illumination image sensor of the second embodiment.

Next, referring to FIG. 9, a well region 900 is formed in the epitaxial layer 800 and extends into the epitaxial substrate 600. Due to the existence of the shallow trench isolation structure STI, the bottom profile of the well region 900 may be concave. Moreover, the well region 900 is generally formed by an ion implantation process, so a thin oxide layer 902 may be formed before ion implantation process on the first surface S1 of the epitaxial substrate 600 and the surface of the epitaxial layer 800.

Figure 10A:
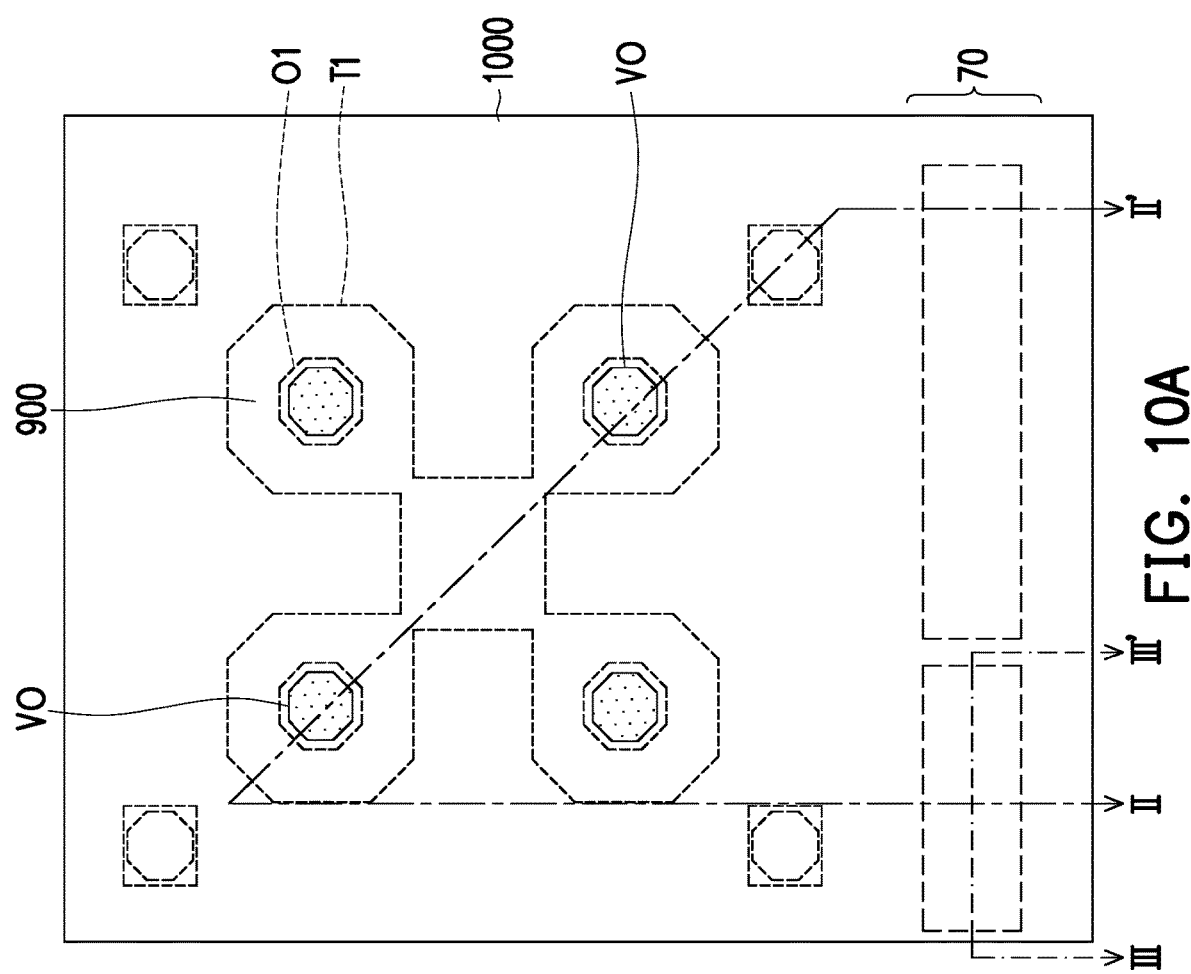
FIG. 10A and FIG. 10B each are a plan view and a cross-sectional view illustrating steps of forming a vertical hole of the back side illumination image sensor of the second embodiment.
Figure 10B:
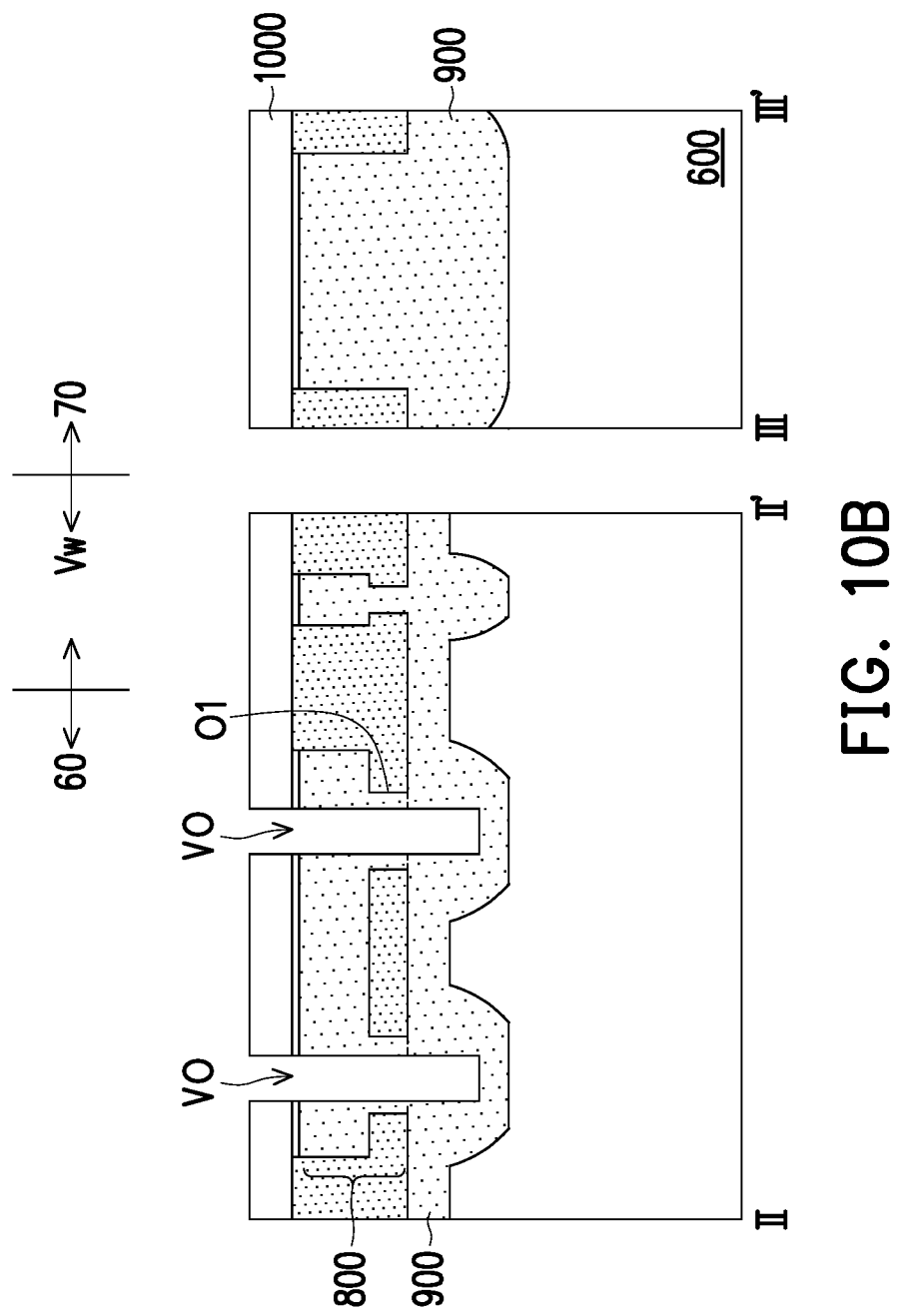

Next, referring to FIG. 10A and FIG. 10B, FIG. 10A is a plan view, and FIG. 10B is a cross-sectional view illustrating line segment II-II' and line segment III-III' of FIG. 10A. Multiple vertical holes VO passing through the openings O1 are formed in the epitaxial layer 800 as predetermined positions where vertical transfer gates are formed. In the method of forming the vertical holes VO, for example, a hard mask layer 1000 is first formed on the epitaxial substrate 600 and the epitaxial layer 800, next the predetermined positions where the vertical holes VO are formed are defined in the hard mask layer 1000, and then etching is performed until the vertical holes VO are formed.

Figure 11A:
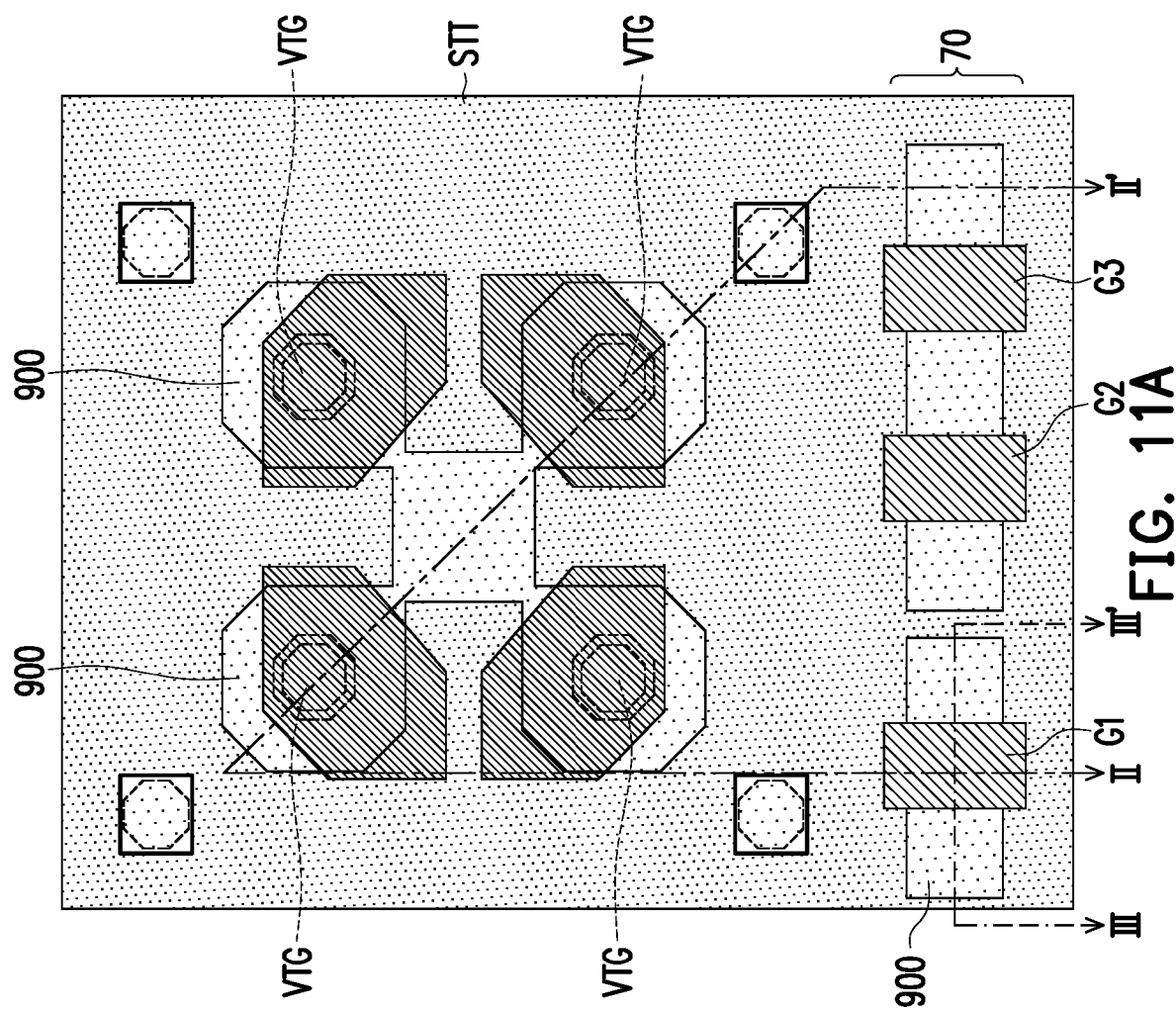
FIG. 11A and FIG. 11B each are a plan view and a cross-sectional view illustrating steps of forming a vertical transfer gate of the back side illumination image sensor of the second embodiment.
Figure 11B:
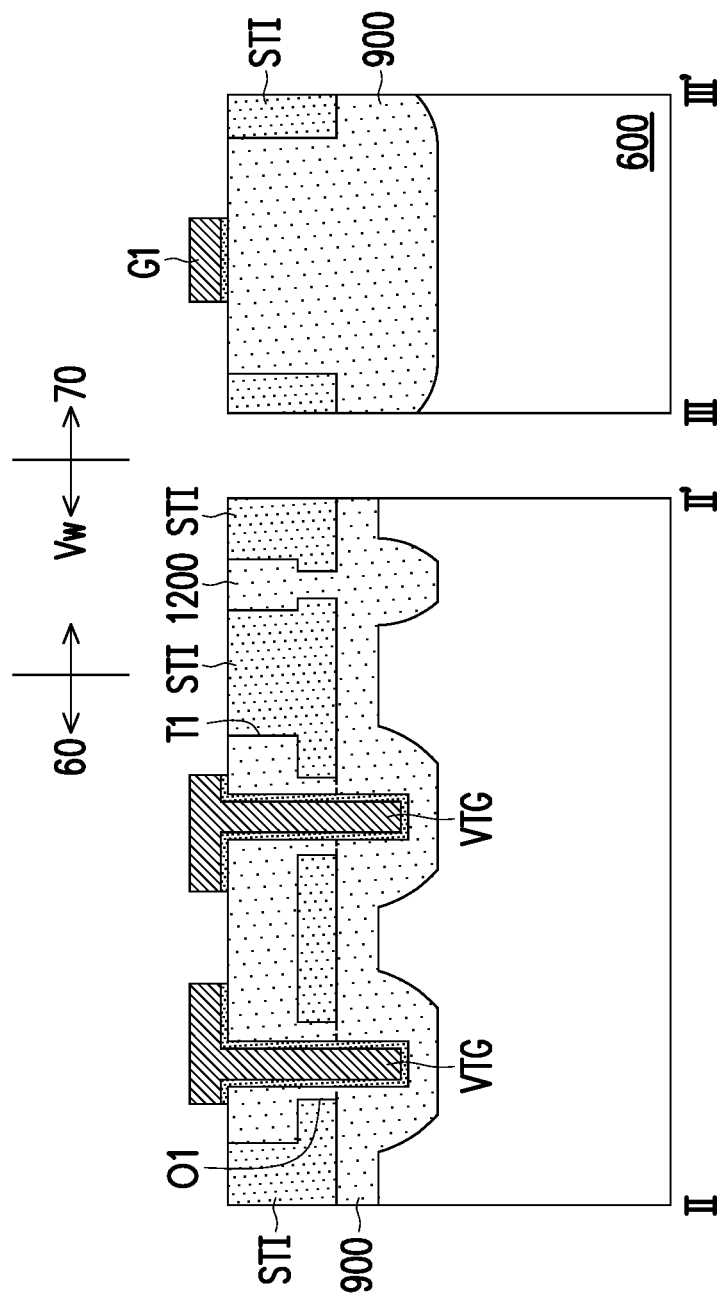

Next, referring to FIG. 11A and FIG. 11B, FIG. 11A is a plan view, and FIG. 11B is a cross-sectional view illustrating line segment II-II' and line segment III-III' of FIG. 11A. Multiple vertical transfer gates VTG passing through the openings O1 are formed in the epitaxial layer 800. In the method of forming the vertical transfer gate VTG, for example, a gate oxide layer and a polysilicon layer are first formed, next the vertical transfer gate VTG is defined, and meanwhile gate structures G1, G2, and G3 are formed in the transistor region 70.

Figure 12A:
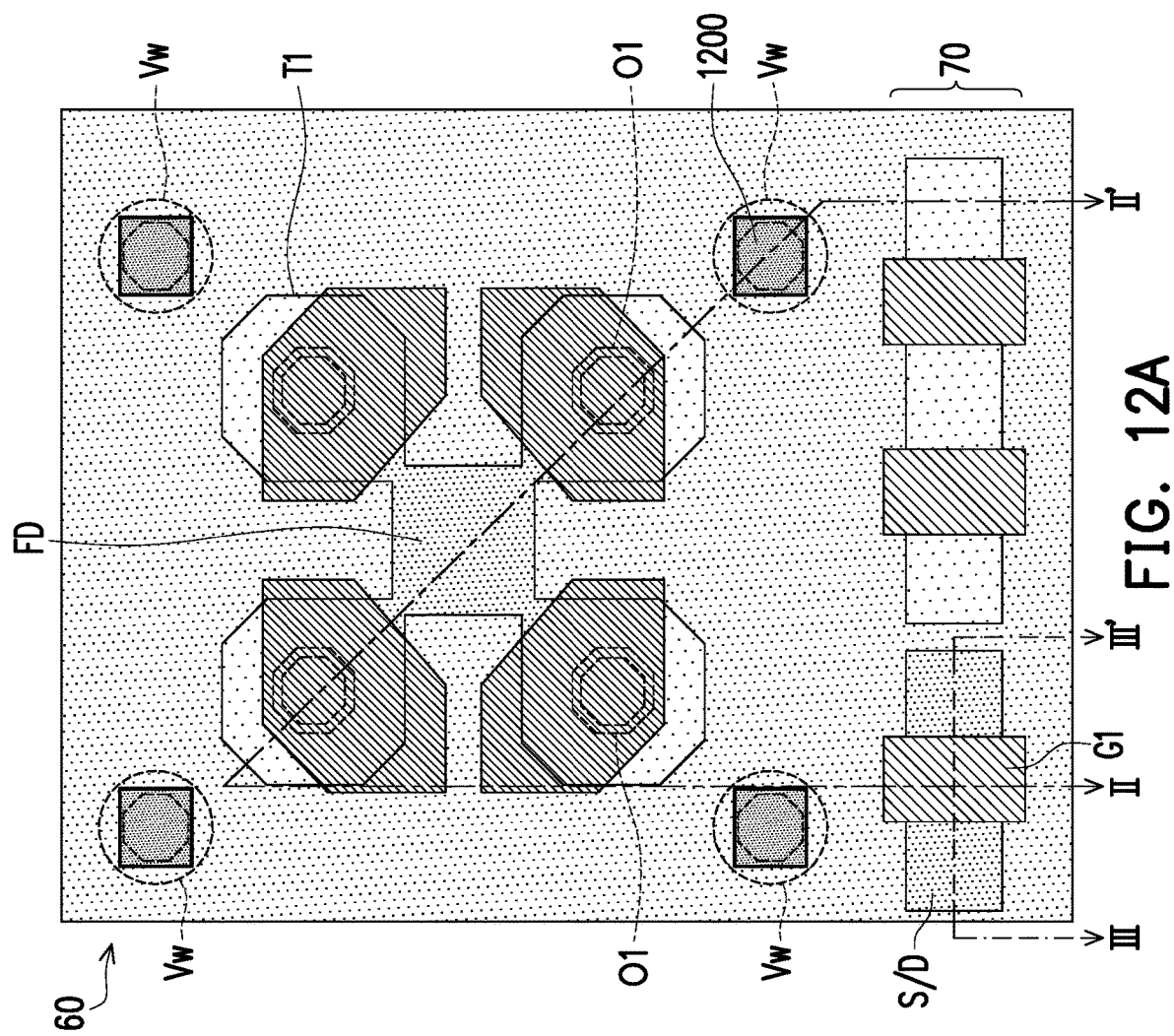
FIG. 12A and FIG. 12B each are a plan view and a cross-sectional view illustrating steps of forming a floating diffusion region of the back side illumination image sensor of the second embodiment.
Figure 12B:
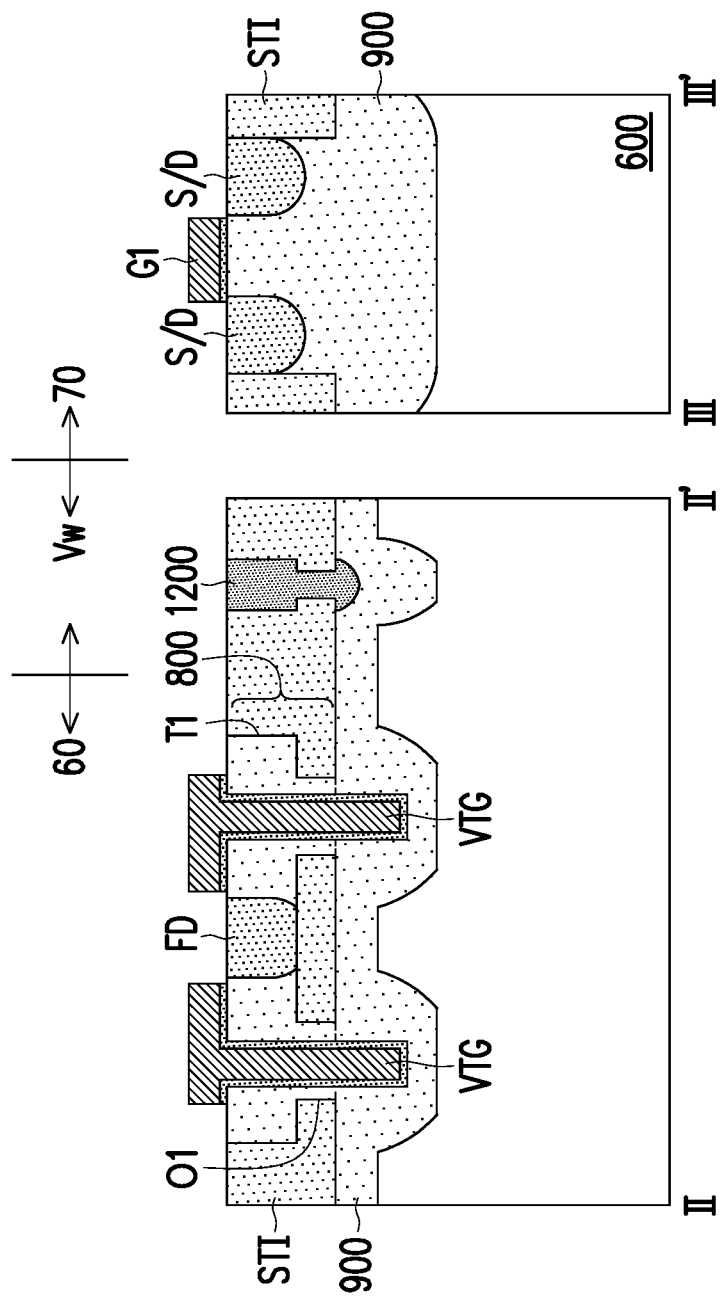

Next, referring to FIG. 12A and FIG. 12B, FIG. 12A is a plan view, and FIG. 12B is a cross-sectional view illustrating line segment II-II' and line segment III-III' of FIG. 12A. The floating diffusion region FD is formed in the epitaxial layer 800 between the vertical transfer gates VTG, and in the plan view (FIG. 12A), the floating diffusion region FD does not overlap with the multiple openings O1. Meanwhile, a source region S/drain region D can be formed in the transistor region 70, so the source region S/drain region D and the floating diffusion region FD can have the same conduction state and concentration, but the disclosure is not limited thereto. The source region S/drain region D may not be fabricated simultaneously with the floating diffusion region FD. For example, a heavily doped region 1200 of the well pickup region Vw is fabricated separately from the floating diffusion region FD and has a conduction state different from that of the floating diffusion region FD.

Figure 13:
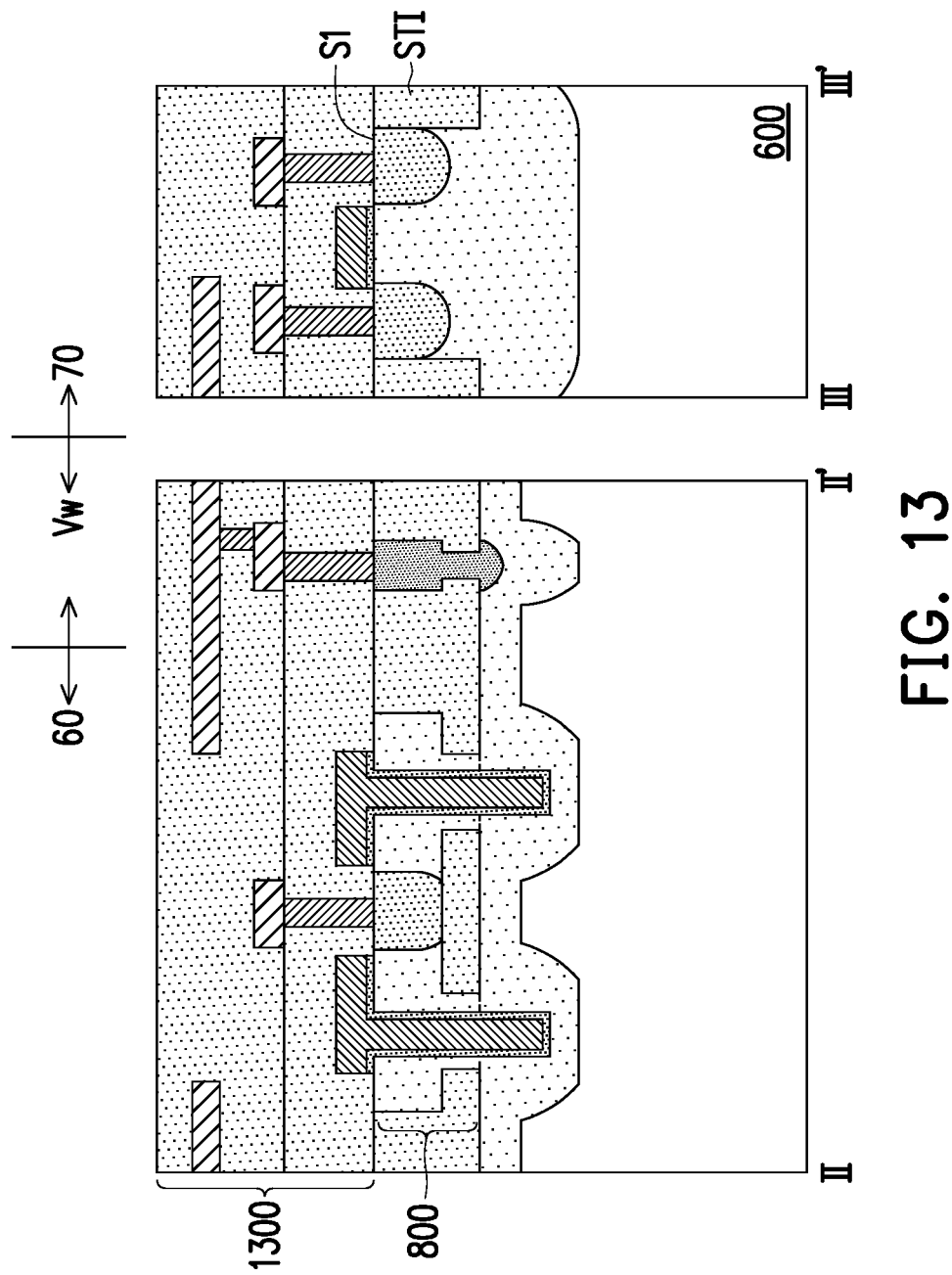
FIG. 13 is a cross-sectional view illustrating steps of forming an interconnection structure of the back side illumination image sensor of the second embodiment.

Subsequently, referring to FIG. 13, an interconnection structure 1300 is formed on the epitaxial layer 800, and the details thereof are the same as those of the interconnection structure 300 of the first embodiment, which are not repeated herein.

Figure 14A:
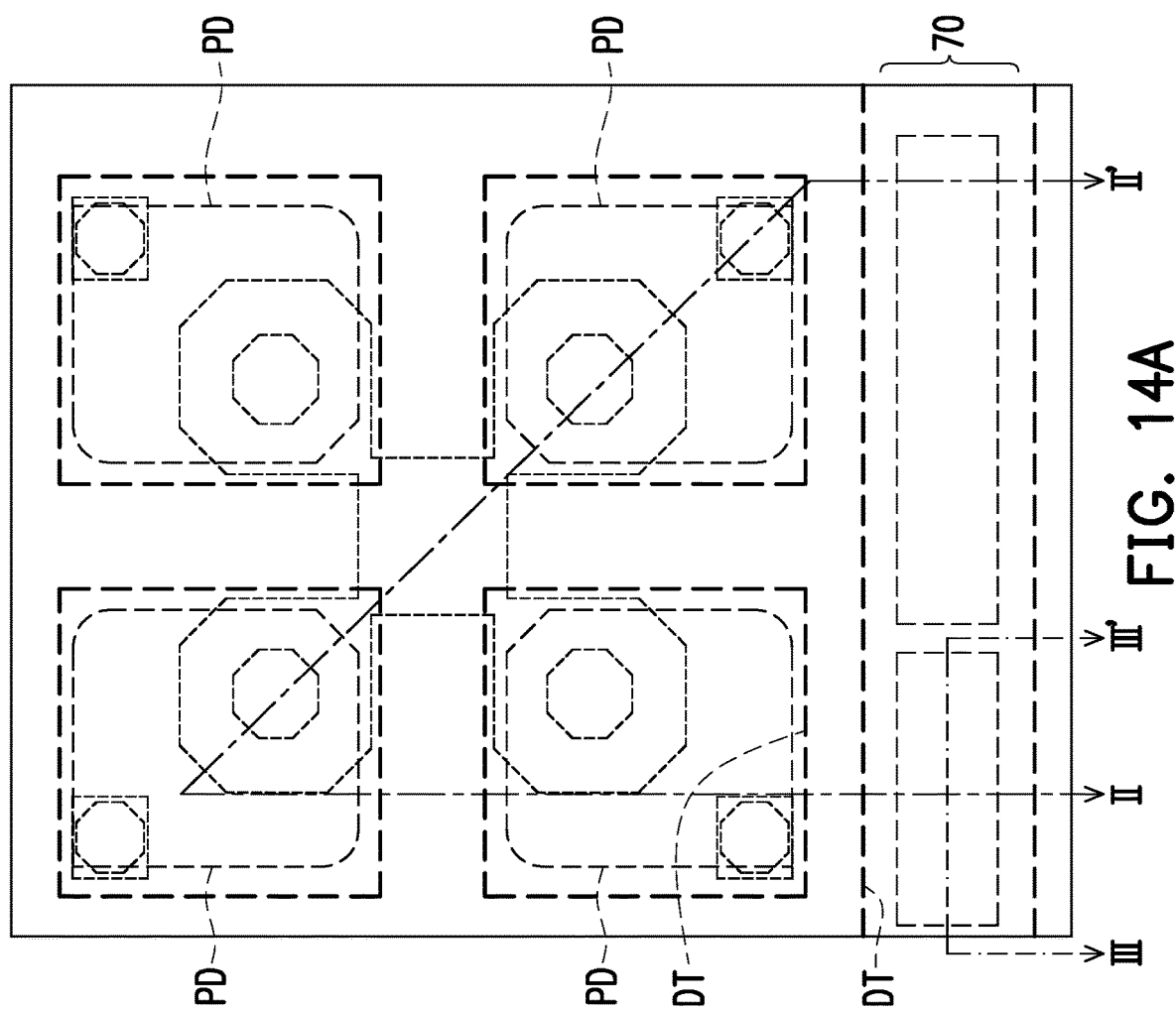
FIG. 14A and FIG. 14B each are a plan view and a cross-sectional view illustrating steps of forming a deep trench of the back side illumination image sensor of the second embodiment.
Figure 14B:
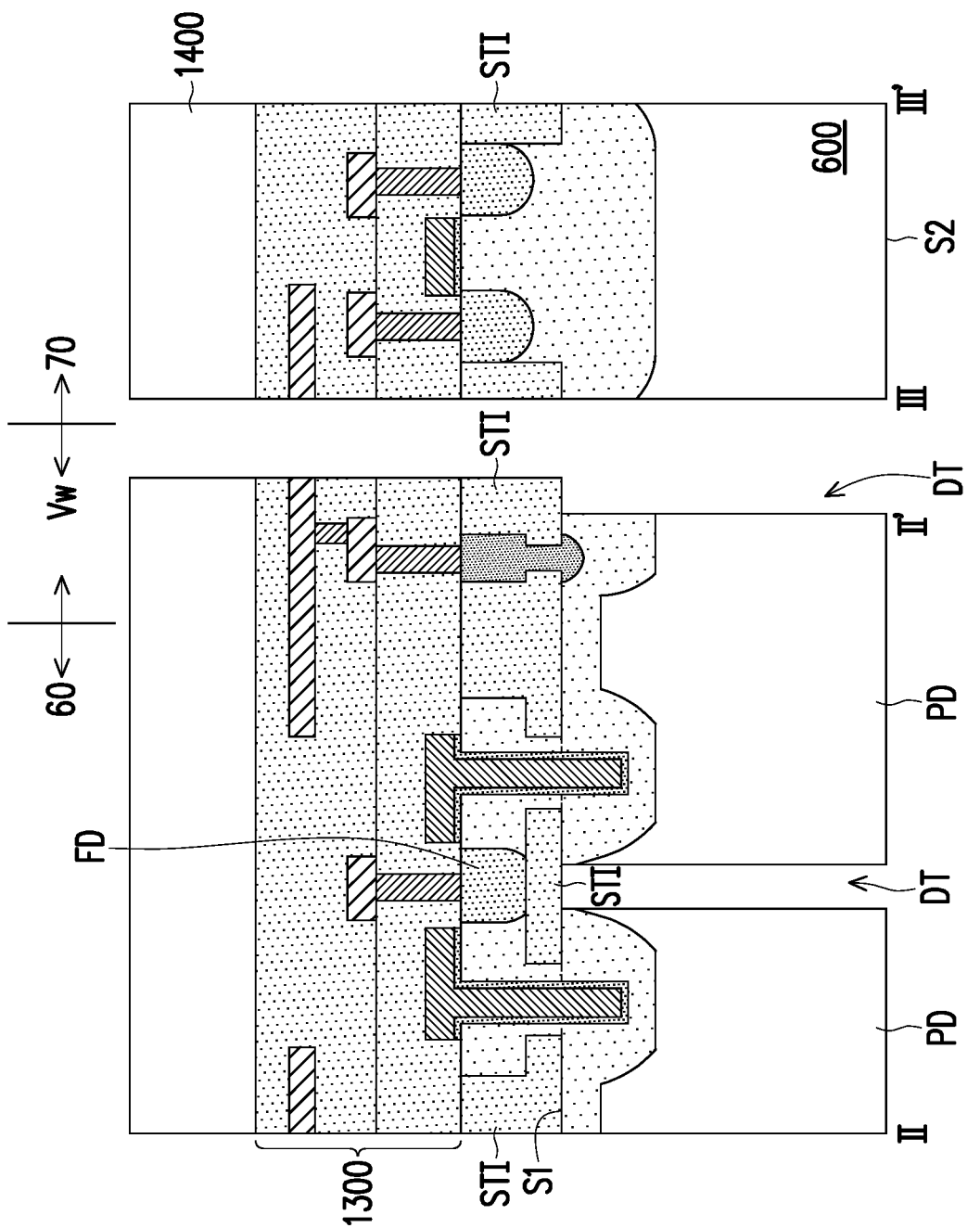

Then referring to FIG. 14A and FIG. 14B, FIG. 14A is a plan view illustrating only a few regions for clarity, and FIG. 14B is a cross-sectional view illustrating line segment II-II' and line segment III-III' of FIG. 14A. A carrier substrate 1400 is bonded to the interconnection structure 1300, then the shallow trench isolation structure STI is used as an etching stop layer, the epitaxial substrate 600 is etched, and a deep trench DT extending from the second surface S2 of the epitaxial substrate 600 to the first surface S1 is formed to divide the epitaxial substrate 600 into multiple photosensitive element regions PD, where the second surface S2 is opposite to the first surface S1. With the shallow trench isolation structure STI under the floating diffusion region FD, the floating diffusion region FD can be prevented from being damaged during the formation of the deep trench DT, thereby reducing the problem of the fixed picture noise (FPN). In one embodiment, before forming the deep trench DT, the epitaxial substrate 600 may be thinned from the second surface S2 of the epitaxial substrate 600.

Figure 15:
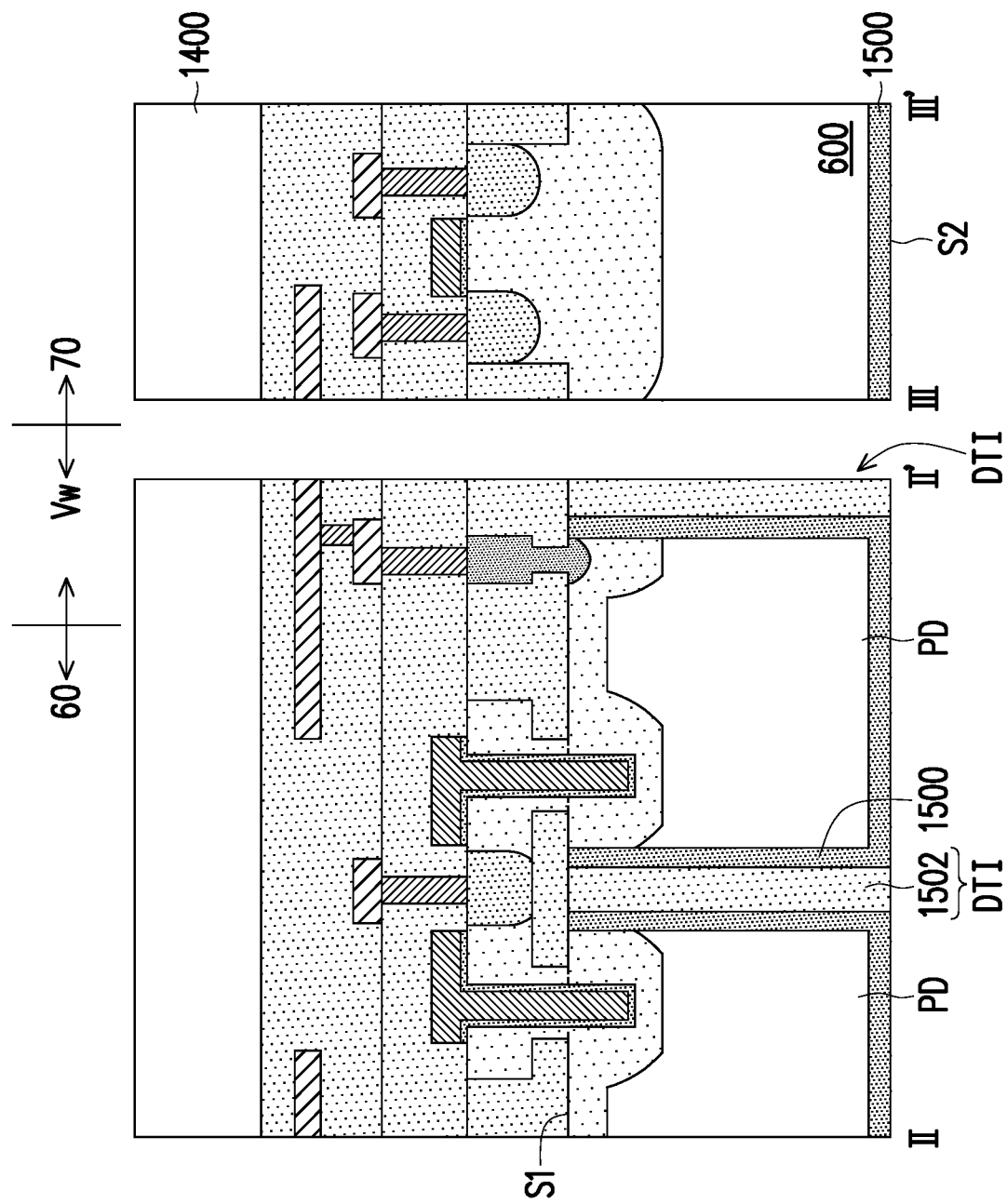
FIG. 15 is a cross-sectional view illustrating steps of forming a deep trench isolation structure of the back side illumination image sensor of the second embodiment.

Next, referring to FIG. 15, a deep trench isolation structure DTI is formed, in which for example, a conformal passivation layer 1500 is formed in the deep trench DT, and a silicon oxide layer 1502 is filled in the deep trench DT, the passivation layer 1500 is obtained, for example, by plasma doping (PLAD) passivation or high dielectric constant (HK) film passivation, and silicon oxide other than the deep trench DT can be removed by a planarization step such as CMP after the silicon oxide layer 1502 is filled in the deep trench DT.

Figure 16:
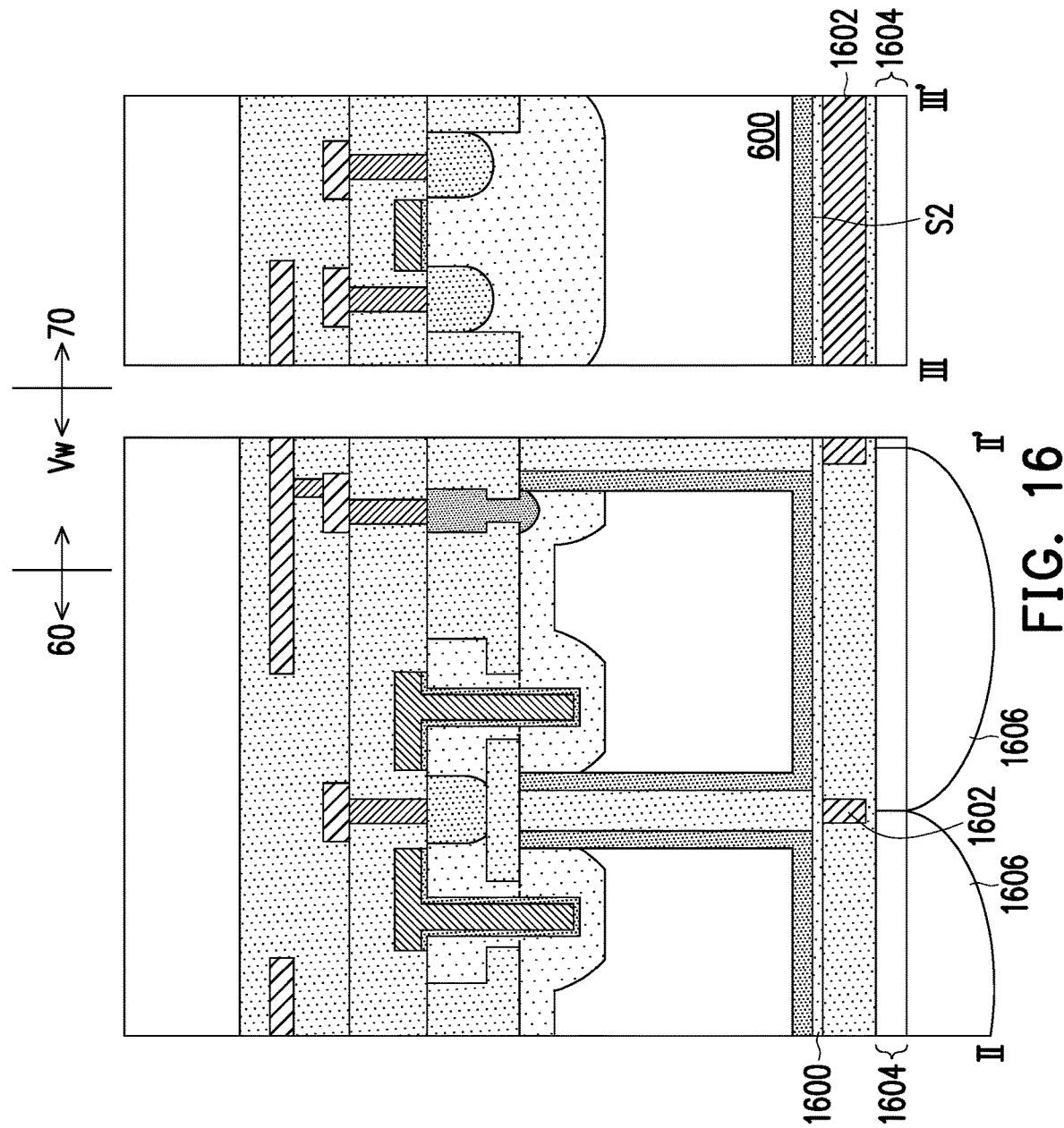
FIG. 16 is a cross-sectional view illustrating steps of forming an optical element of the back side illumination image sensor of the second embodiment.

Next, referring to FIG. 16, an anti-reflection layer 1600 may be formed on the second surface S2 of the epitaxial substrate 600, a metal shielding layer 1602 is formed on the anti-reflection layer 1600, a color filter layer 1604 is formed on the metal shielding layer 1602, then a microlens 1606 is formed on the color filter layer 1604, and the microlens 1606 is usually disposed on the back side illumination image sensor 60. The second surface S2 of the transistor region 70 is substantially covered by a whole metal shielding layer 1602.

Except for the necessary steps, the foregoing steps can be increased or decreased according to the requirements, and the used process and method can also be replaced with conventional technologies and are not limited to the foregoing content.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A back side illumination image sensor comprising:
   an epitaxial substrate having a first surface and a second surface opposite to each other;
   a deep trench isolation structure extending from the second surface to the first surface of the epitaxial substrate to divide the epitaxial substrate into a plurality of regions;
   a buried oxide (BOX) layer disposed on the first surface of the epitaxial substrate, wherein the buried oxide layer has a plurality of openings exposing the plurality of regions;
   an epitaxial layer formed on the first surface of the epitaxial substrate and covering the buried oxide layer;
   a well region formed in the epitaxial layer and extending into the first surface of the epitaxial substrate, wherein the plurality of regions other than the well region become a plurality of photosensitive element regions;
   a floating diffusion (FD) region formed in the well region above the buried oxide layer between the plurality of photosensitive element regions, wherein a width of the buried oxide layer is greater than a width of the floating diffusion region;
   a shallow trench isolation structure disposed in the epitaxial layer and in contact with the buried oxide layer, so that the shallow trench isolation structure, the deep trench isolation structure and the buried oxide layer form a continuous isolation structure; and
   a plurality of vertical transfer gates (VTGs) disposed in the epitaxial layer and passing through the plurality of openings of the buried oxide layer.

2. The back side illumination image sensor according to claim 1, wherein an interface between the well region and the plurality of photosensitive element regions is concave.

3. The back side illumination image sensor according to claim 1, wherein the plurality of openings have inclined sidewalls.

4. The back side illumination image sensor according to claim 1, wherein the plurality of vertical transfer gates have inclined sidewalls.

5. The back side illumination image sensor according to claim 1, wherein the buried oxide layer is in direct contact with the deep trench isolation structure.

6. The back side illumination image sensor according to claim 1, wherein in a plan view, an area of each opening of the buried oxide layer is less than an area of each of the photosensitive element regions.

7. The back side illumination image sensor according to claim 1, further comprising:
   an anti-reflection layer disposed on the second surface of the epitaxial substrate;
   a metal shielding layer disposed on the anti-reflection layer;
   a color filter layer disposed on the metal shielding layer; and
   a microlens disposed on the color filter layer.

8. The back side illumination image sensor according to claim 1, wherein the epitaxial layer and the epitaxial substrate are made of the same material.

9. The back side illumination image sensor according to claim 1, further comprising:
   an interconnection structure disposed on the epitaxial layer; and
   a carrier substrate disposed on the interconnection structure.

10. A method of manufacturing a back side illumination image sensor, comprising:
    forming a shallow trench isolation structure on a first surface of an epitaxial substrate;
    forming a plurality of openings and a plurality of trenches in the shallow trench isolation structure, wherein the trenches are located above the plurality of openings, and the plurality of openings expose the epitaxial substrate;
    forming an epitaxial layer in the plurality of openings and the trenches;
    forming a well region in the epitaxial layer and extending into the epitaxial substrate;
    forming a plurality of vertical transfer gates (VTGs) passing through the plurality of openings in the epitaxial layer;
    forming a floating diffusion (FD) region in the epitaxial layer between the plurality of vertical transfer gates, wherein the floating diffusion region and the plurality of openings do not overlap each other in a plan view; and
    forming a deep trench isolation structure extending from the second surface to the first surface of the epitaxial substrate to divide the epitaxial substrate into a plurality of photosensitive element regions, wherein the second surface is opposite to the first surface.

11. The method of manufacturing the back side illumination image sensor according to claim 10, wherein the step of forming the deep trench isolation structure comprises:
    by using the shallow trench isolation structure as an etching stop layer, etching the epitaxial substrate to form a deep trench;

forming a conformal passivation layer within the deep trench; and filling the silicon oxide layer in the deep trench.

12. The method of manufacturing the back side illumination image sensor according to claim 10, wherein the step of forming the epitaxial layer comprises an epitaxial lateral overgrowth process.

13. The method of manufacturing the back side illumination image sensor according to claim 10, further comprising thinning the epitaxial substrate from the second surface of the epitaxial substrate before forming the deep trench isolation structure.

14. The method of manufacturing the back side illumination image sensor according to claim 10, after forming the deep trench isolation structure further comprising:

forming an anti-reflection layer on the second surface of the epitaxial substrate;

forming a metal shielding layer on the anti-reflection layer;

forming a color filter layer on the metal shielding layer; and forming a microlens on the color filter layer.

15. The method of manufacturing the back side illumination image sensor according to claim 10, after forming the floating diffusion region, further comprising:

forming an interconnection structure on the epitaxial layer; and bonding a carrier substrate to the interconnection structure.

\* \* \* \* \*